(12) United States Patent
Hara

(10) Patent No.: US 8,656,197 B2
(45) Date of Patent: Feb. 18, 2014

(54) SEMICONDUCTOR DEVICE AND CONTROL METHOD FOR SEMICONDUCTOR DEVICE

(71) Applicant: Fujitsu Limited, Kawasaki (JP)

(72) Inventor: Michiharu Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/717,829

(22) Filed: Dec. 18, 2012

(65) Prior Publication Data

US 2013/0249610 A1    Sep. 26, 2013

(30) Foreign Application Priority Data

Mar. 22, 2012   (JP) ................................ 2012-065898

(51) Int. Cl.
*G06F 1/32*   (2006.01)
*G06F 1/04*   (2006.01)

(52) U.S. Cl.
USPC ............ 713/322; 713/501; 327/106; 327/113

(58) Field of Classification Search
USPC ......... 327/105, 106, 113, 114, 149, 151, 159, 327/160; 713/300, 322, 500–503
See application file for complete search history.

(56) References Cited

U.S. PATENT DOCUMENTS

| | | | | |
|---|---|---|---|---|
| 5,778,237 | A * | 7/1998 | Yamamoto et al. ............ | 713/322 |
| 6,778,418 | B2 * | 8/2004 | Meguro ......................... | 363/165 |
| 7,013,406 | B2 * | 3/2006 | Naveh et al. ................... | 713/501 |
| 7,228,446 | B2 * | 6/2007 | Jorgenson et al. ............. | 713/322 |
| 7,356,726 | B2 * | 4/2008 | Shimoyama et al. .......... | 713/600 |

FOREIGN PATENT DOCUMENTS

| | | |
|---|---|---|
| JP | 2003-150283 A | 5/2003 |
| JP | 2008-107962 A | 5/2008 |

* cited by examiner

*Primary Examiner* — Patrick O'Neill
(74) *Attorney, Agent, or Firm* — Fujitsu Patent Center

(57) ABSTRACT

A semiconductor device includes: a frequency setting information storage unit that stores sets of frequency information indicating setting of a frequency supplied by an oscillation unit and frequency identification information identifying the frequency information and outputs one of a plurality of pieces of the frequency information to the oscillation unit based on frequency identification information inputted thereinto; a speed setting information storage unit that stores speed identification information indicating a speed of the semiconductor device and frequency identification information corresponding to the speed identification information; a frequency identification information count unit that holds a value of the frequency identification information inputted into the frequency setting information storage unit; and a control unit that causes the frequency identification information count unit to increment or decrement the held value of the frequency identification information to approach a value of the frequency identification information stored in the speed setting information storage unit.

8 Claims, 6 Drawing Sheets

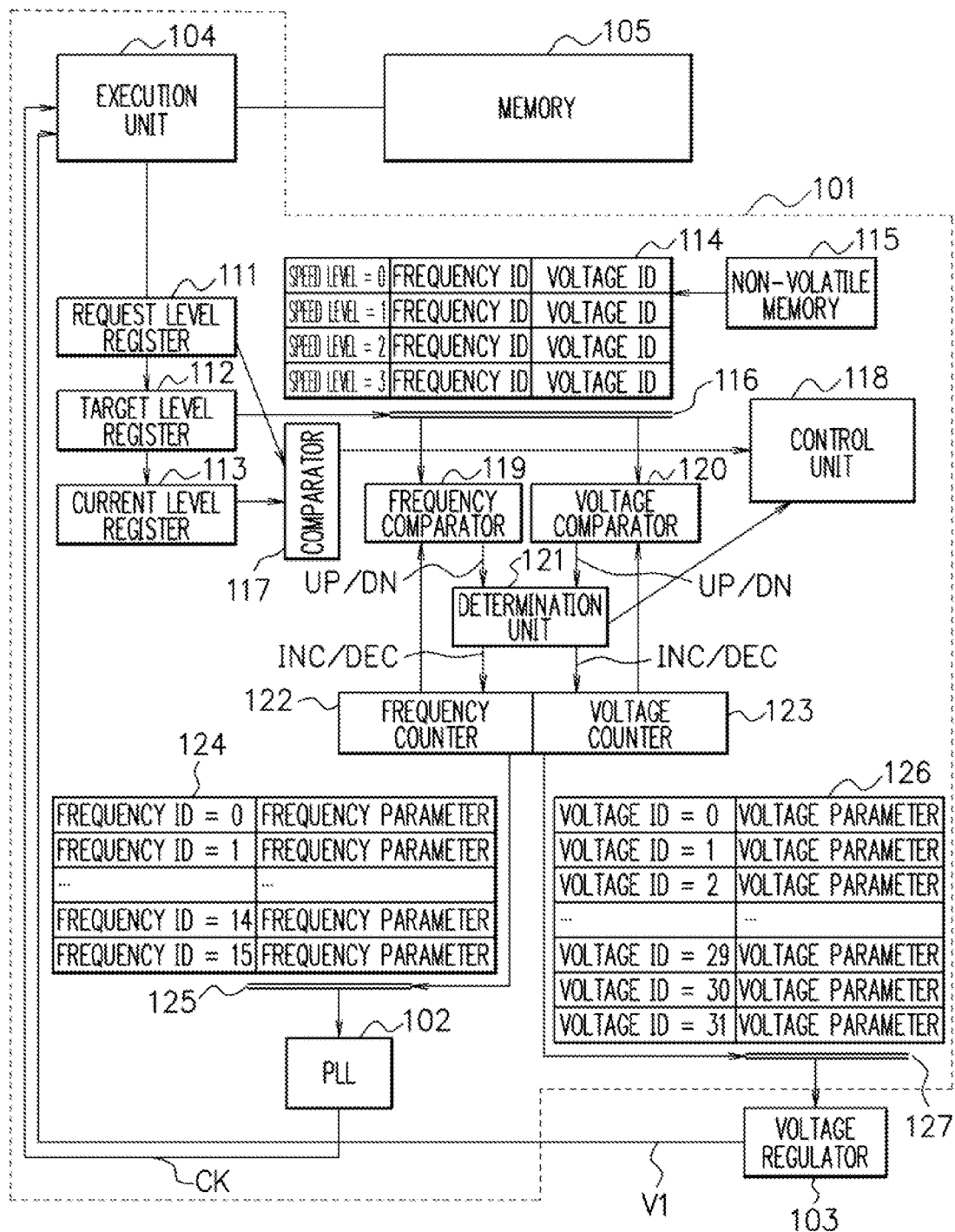
F I G. 1

| FREQUENCY ID | FREQUENCY PARAMETER |
|---|---|
| 0 | 0.1GHz |
| 1 | 0.2GHz |
| 2 | 0.3GHz |
| 3 | 0.4GHz |
| 4 | 0.5GHz |
| 5 | 0.6GHz |
| 6 | 0.7GHz |
| 7 | 0.8GHz |
| 8 | 0.9GHz |
| 9 | 1.0GHz |
| 10 | 1.1GHz |
| 11 | 1.2GHz |
| 12 | 1.3GHz |
| 13 | 1.4GHz |
| 14 | 1.5GHz |
| 15 | 1.6GHz |

| VOLTAGE ID | VOLTAGE PARAMETER |
|---|---|
| 0 | 0.20V |
| 1 | 0.25V |
| 2 | 0.30V |
| 3 | 0.35V |
| 4 | 0.40V |
| 5 | 0.45V |
| 6 | 0.50V |
| 7 | 0.55V |
| 8 | 0.60V |
| 9 | 0.65V |
| 10 | 0.70V |
| 11 | 0.75V |
| 12 | 0.80V |
| 13 | 0.85V |
| 14 | 0.90V |
| 15 | 0.95V |
| 16 | 1.00V |
| 17 | 1.05V |
| 18 | 1.10V |
| 19 | 1.15V |
| ... | ... |
| 28 | 1.60V |
| 29 | 1.65V |
| 30 | 1.70V |
| 31 | 1.75V |

| SPEED LEVEL | FREQUENCY(PROCESSING PERFORMANCE) |
|---|---|
| 0 | 120% |
| 1 (STANDARD) | 100% |
| 2 | 60% |
| 3 | 20% |

F I G. 4A
| SPEED LEVEL | FREQUENCY ID | VOLTAGE ID |
|---|---|---|
| 0 | 11 (1.2GHz) | 28 (1.60V) |
| 1 (STANDARD) | 9 (1.0GHz) | 18 (1.10V) |
| 2 | 5 (0.6GHz) | 15 (0.95V) |
| 3 | 1 (0.2GHz) | 2 (0.30V) |
~114
F I G. 4B
| SPEED LEVEL | FREQUENCY ID | VOLTAGE ID |
|---|---|---|
| 0 | 11 (1.2GHz) | 29 (1.65V) |
| 1 (STANDARD) | 9 (1.0GHz) | 19 (1.15V) |
| 2 | 5 (0.6GHz) | 15 (0.95V) |
| 3 | 1 (0.2GHz) | 2 (0.30V) |
~114
F I G. 4C
| SPEED LEVEL | FREQUENCY ID | VOLTAGE ID |
|---|---|---|
| 0 | 12 (1.3GHz) | 30 (1.70V) |
| 1 (STANDARD) | 11 (1.2GHz) | 29 (1.65V) |
| 2 | 7 (0.8GHz) | 17 (1.05V) |
| 3 | 3 (0.4GHz) | 3 (0.35V) |
~114
F I G. 5
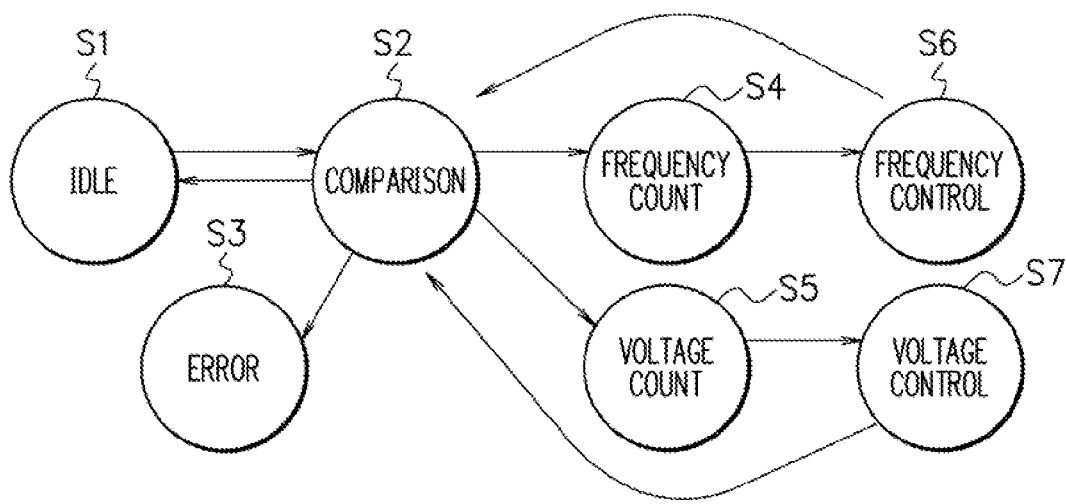

F I G. 6

| FREQUENCY COMPARATOR | | VOLTAGE COMPARATOR | | NEXT STATE |
|---|---|---|---|---|
| UP | DN | UP | DN | |
| 0 | 0 | 0 | 0 | IDLE |
| 0 | 0 | 0 | 1 | VOLTAGE COUNT |
| 0 | 0 | 1 | 0 | VOLTAGE COUNT |
| 0 | 0 | 1 | 1 | ERROR |
| 0 | 1 | 0 | 0 | FREQUENCY COUNT |
| 0 | 1 | 0 | 1 | FREQUENCY COUNT |
| 0 | 1 | 1 | 0 | ERROR |
| 0 | 1 | 1 | 1 | ERROR |
| 1 | 0 | 0 | 0 | FREQUENCY COUNT |
| 1 | 0 | 0 | 1 | ERROR |
| 1 | 0 | 1 | 0 | VOLTAGE COUNT |
| 1 | 0 | 1 | 1 | ERROR |
| 1 | 1 | 0 | 0 | ERROR |
| 1 | 1 | 0 | 1 | ERROR |
| 1 | 1 | 1 | 0 | ERROR |
| 1 | 1 | 1 | 1 | ERROR |

F I G. 7
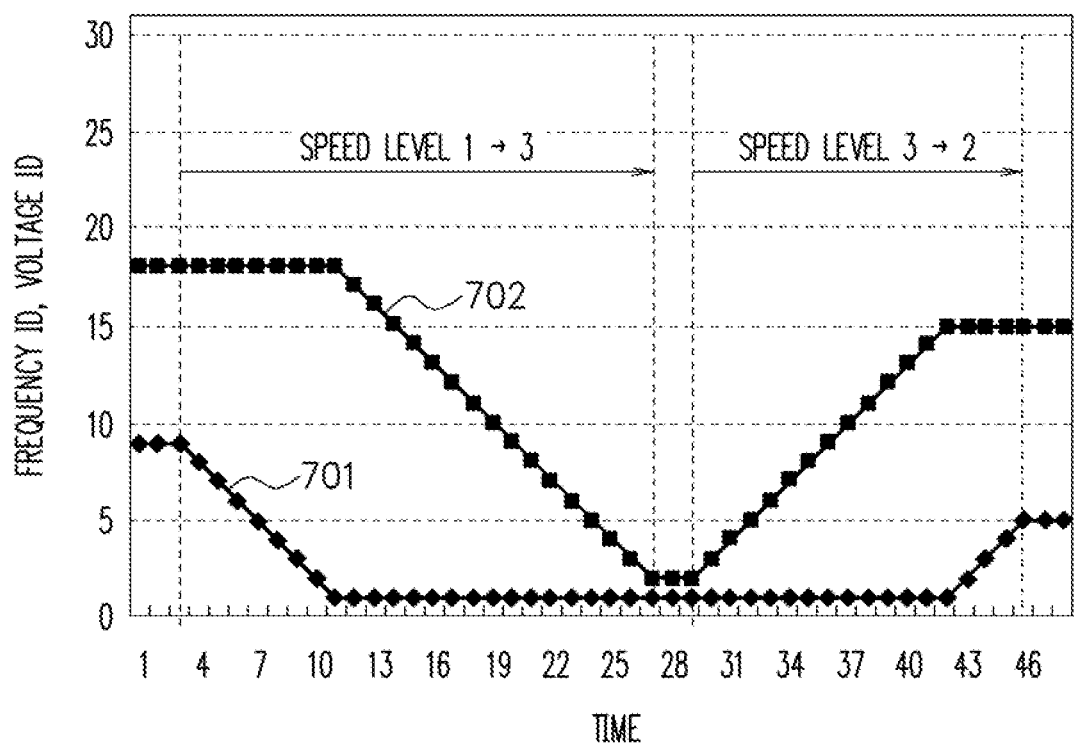

SEMICONDUCTOR DEVICE AND CONTROL METHOD FOR SEMICONDUCTOR DEVICE

CROSS-REFERENCES TO RELATED APPLICATION

This application is based upon and claims the benefit of priority of the prior Japanese Patent Application No. 2012-065838, filed on Mar. 22, 2012, the entire contents of which are incorporated herein by reference.

FIELD

The embodiment discussed herein is directed to a semiconductor device and a control method for the semiconductor device.

BACKGROUND

In a power control device which includes a power control circuit that controls power and a circuit control unit that controls the power control circuit, the power control circuit including a power setting field for setting a predetermined value of power, a power control, unit that controls power, and a control effective field for setting an effective state indicating that the power control unit is in a state of executing control of power, the technique of performing the following control is known (see, for example, Patent Document 1). Specifically, when the control effective field is set in the effective state, the power control unit executes control of power so that when a predetermined operation to the power control circuit is executed from the outside of the power control circuit, the circuit control unit sets the control effective field into the effective state, and stops the predetermined operation until the power reaches the value of the power set in the power setting field.

Further, in an electronic device which includes a power supply unit, a clock signal generation unit, an arithmetic processing circuit including processing core unit, and a power saving control unit that controls shift processing between a normal mode and a power saving mode, a technique of performing the following control is known (see, for example, Patent Document 2). Specifically, the power saving control unit validates a clock frequency down signal to the clock signal generation unit when shifting to the power saving mode, and validates a voltage down signal to the power supply unit after a lapse of a first time. Then, when the clock frequency down signal is validated, the clock signal generation unit gradually changes the frequency of the clock to be supplied to the arithmetic processing circuit from a first frequency to a second frequency lower than the first frequency. Further, when the voltage down signal is validated, the power supply unit decreases the voltage to be supplied to the arithmetic processing core unit of the arithmetic processing circuit from a first voltage to a second voltage lower than the first voltage.

Patent Document 1: Japanese Laid-open Patent Publication No. 2003-150283
Patent Document 2: Japanese Laid-open Patent Publication No. 2008-107962

There is a known processor which controls, by a frequency parameter set in a PLL (Phase Locked Loop) setting register, the frequency of a clock signal oscillated by a PLL, and controls the voltage inside the processor by a voltage parameter set in a voltage control register. In recent years, with increase in the number of processors mounted in an information processing device such as a server or the like, power saving of the whole information processing device is required, and it is a problem in the technical field of the processor to reduce the power consumption of the individual processor included in the information processing device. It is generally known that the power consumption of the semiconductor device such as the processor or the like is proportional to the product of the square of the power supply voltage to be supplied to the circuit inside the semiconductor device and the frequency. Accordingly, to reduce the power consumption of the processor, it is desired to appropriately control the frequency and the voltage. However, due to the individual difference caused by the variation in kind of the processor and semiconductor process manufacturing the processor, the frequency parameter and the voltage parameter suitable of each processor are different. For this reason, to appropriately control the frequency parameter and the voltage parameter, software performing complex control to absorb the variation in the kind of the processor and the semiconductor process is required.

SUMMARY

A semiconductor device includes: an oscillation unit that supplies an oscillated clock to a circuit included in the semiconductor device; a frequency setting information storage unit that stores a plurality of sets of frequency information indicating setting of a frequency supplied by the oscillation unit and frequency identification information identifying the frequency information and outputs one of a plurality of pieces of the frequency information to the oscillation unit based on frequency identification information inputted thereinto; a speed setting information storage unit that stores speed identification information indicating a speed of the semiconductor device and frequency identification information corresponding to the speed identification information; a frequency identification information count unit that holds a value of the frequency identification information inputted into the frequency selling information storage unit; and a control unit that causes the frequency identification information count unit to increment or decrement the held value of the frequency identification information to approach a value of the frequency identification information stored in the speed setting information storage unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a semiconductor device according to an embodiment;

FIG. 2A is a diagram illustrating an example of a frequency table in FIG. 1, and FIG. 2B is a diagram illustrating an example of a voltage table in FIG. 1;

FIGS. 4A to 4C are diagrams illustrating examples of a speed level table in FIG. 1;

FIG. 5 is diagram illustrating state transition controlled by a control unit in FIG. 1;

FIG. 6 is a diagram for explaining transition, from a comparison state to a next state in FIG. 5; and FIG. 7 is a time chart illustrating a control example of an arithmetic processing device in FIG. 1.

DESCRIPTION OF EMBODIMENTS

Figures 3A, 3B:
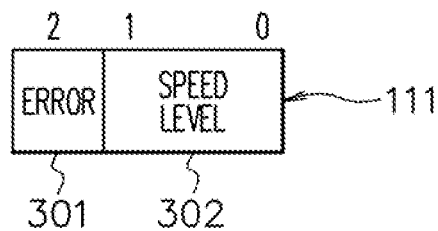
FIGS. 3A and 3B are diagrams for explaining a request level register in FIG. 1.

FIG. 1 is a diagram illustrating a configuration example of a semiconductor device according to an embodiment. An arithmetic processing device 101 is, for example, a processor and has a phase locked loop (PLL) circuit 102, an execution unit 104, a request level register 111, a target level register 112, a current level register 113, a speed level table 114, a non-volatile memory 115, a speed level selector 116, a comparator 117, a control unit 118, a frequency comparator 119, a voltage comparator 120, a determination unit 121, a frequency counter 122, a voltage counter 123, a frequency table 124, a frequency selector 125, a voltage table 126, and a voltage selector 127. To the arithmetic processing device 101, a memory 105 and a voltage regulator 103 are connected.

The arithmetic processing device 101 inputs a frequency parameter into the phase locked loop circuit 102 to perform setting of a frequency and inputs a voltage parameter into the voltage regulator 103 to perform setting of voltage. The phase locked loop circuit 102 generates a clock signal CK having a frequency according to the inputted frequency parameter and outputs the clock signal CK to the execution unit 104. The execution unit 104 executes a program (including OS: Operating System) stored in the memory 105 in synchronization with the clock signal CK to perform various kinds of processing. The voltage regulator 103 generates a voltage V1 with a magnitude according to the inputted voltage parameter and outputs the voltage V1 to the execution unit 104. The execution unit 104 receives supply of the voltage V1 to operate. The arithmetic processing device 101 can control the frequency of the clock signal CK by the frequency parameter and control the magnitude of the voltage V1 by the voltage parameter.

Here, a problem in the case where the execution unit 104 executes the program to control the frequency parameter of the phase locked loop circuit 102 and the voltage parameter of the voltage regulator 103 will be explained for instance.

In recent years, in the field of semiconductor devices such as a SoC (System on Chip) including a processor, an ASIC (Application Specific Integrated Circuit) and so on, the semiconductor device is manufactured in cooperation by division system of a user manufacturer that plans and designs the semiconductor and a semiconductor foundry that manufactures the semiconductor. When the semiconductor device is manufactured by division system of the user manufacturer and the semiconductor foundry, the phase locked loop circuit 102 is built in the arithmetic processing device 101 and provided to the semiconductor foundry to the user manufacturer, but there is no standardized interface and the kind and the value of the frequency parameter are different for each semiconductor foundry. Further, even in the same semiconductor foundry, the kind and the value of the frequency parameter are different depending on the kind of the phase looked loop circuit 102 and the generation of the semiconductor process. Therefore, when providing the arithmetic processing circuit 101 employing a new phase locked loop circuit 102, it is necessary, first of all, to support the phase locked loop circuit 102 by the program and thus impossible to easily provide a new arithmetic processing device 101.

Further, the change of the voltage V1 is performed using an interface (VID) that is the standard in the industry. The voltage regulator 103 needs to generate an appropriate voltage V1 for the arithmetic processing device 101 to operate at the frequency of the clock signal CK. Since the setting value of the appropriate voltage V1 is a value different for each individual chip of the arithmetic processing device 101 decided in various tests during manufacture of the arithmetic processing device 101, the program needs to know the appropriate voltage parameter for each chip and change the voltage parameter for each chip.

Further, if the frequency of the clock signal CK is changed not stepwise but greatly during the operation of the processor, the load greatly changes to cause a large power noise as a result. Further, if the voltage is changed not stepwise but greatly, the power supply becomes unstable to cause the operation of circuits in the processor unstable. Therefore, when changing the frequency and/or the voltage, it is necessary to perform control such as not to change them to target values at once but to change them stepwise to the target values.

Further, the change of the frequency and/or the voltage requires time on the order of microsecond to millisecond at one time. When this processing is performed by the program operating on the arithmetic processing device 101, the operation of the change of the frequency and/or the voltage and the waiting for the change will be repeatedly performed to waste the processing ability of the arithmetic processing device 101. Further, how much the change may be performed at one time depends on the design of the arithmetic processing device 101 and the power supply, so that the program will depend on the hardware of the arithmetic processing device 101 that is the object to be changed.

Hereinafter, an embodiment to solve the above problem will be explained. FIG. 2A is a diagram illustrating an example of the frequency table 124 in FIG. 1, and a frequency in a unit of 0.1 GHz at 16 steps can be controlled. The frequency table 124 stores the correspondence for a plurality of sets of the frequency identification numbers (frequency ID: Identification) "0" to "15" and the frequency parameters of "0.1" GHz to "1.6" GHz in the order of frequency and in the order of the frequency identification number. The frequency parameter is a digital code for controlling the frequency of the clock signal CK generated by the phase locked loop circuit 102. For example, "0" of the frequency identification number is stored in association with the frequency parameter of a frequency of 0.1 GHz and "1" of the frequency identification number is stored in association with the frequency parameter of a frequency of 0.2 GHz. Then, the frequency parameters in the frequency table 124 are similarly stored in the order of the frequency identification numbers "0" to "15" and in the order of the frequencies of "0.1" GHz to "1.6" GHz. The orders may be either ascending orders or descending orders.

FIG. 2B is a diagram illustrating an example of the voltage table 126 in FIG. 1, and a voltage in a unit of 0.05 V at 32 steps can be controlled. The voltage table 126 stores the correspondence for a plurality of sets of the voltage identification numbers (voltage ID: Identification) "0" to "31" and the voltage parameters of "0.02" V to "1.75" V in the order of voltage and in the order of the voltage identification number. The voltage parameter is a digital code for controlling the value of the voltage V1 generated by the voltage regulator 103. For example, "0" of the voltage identification number is stored in association with the voltage parameter of a voltage of 0.02 V and "1" of the voltage identification number is stored in association with the voltage parameter of a voltage of 0.25 V. Then, the voltage parameters in the voltage table 126 are similarly stored in the order of the voltage identification numbers "0" to "31" and in the order of the voltages of "0.02" V to "1.75" V. The orders may be either ascending orders or descending orders.

The frequency table 124 and the voltage table 126 may be configured such that a part thereof is composed of a variable register and the other part is composed of a simple connection to a power supply potential node or a ground potential node (ground node) to take a fixed value. A part of fixed values of the frequency table 124 and the voltage table 126 which are never varied can be realized by a simple configuration so that even if the variation ranges of frequency and voltage are increased, the circuit scale can be reduced.

More specifically, the relation between the frequency identification number and the frequency parameter in the frequency table 124 and the relation between the voltage identification number and the voltage parameter in the voltage table 126 are decided at the design stage of the arithmetic processing device 101, and many of the concrete value of each frequency parameter to the PLL 102 and the concrete value of each voltage parameter to the voltage regulator are decided at the design stage. Therefore, it is possible that most of the frequency parameters and the voltage parameters are constituted not by an updatable register but by a simple connection to the power supply node or the ground node, and only parameters requiring adjustment after the manufacture are constituted of an updatable register, whereby the circuit area can be reduced.

In FIG. 1, the execution unit 104 executes the program stored in the memory 105 to write a requesting speed level into the request level register 111 about the speed level that is the rate of change of the frequency when the standard operating frequency during system operation is set to 100%. The execution unit 104 only writes the speed level into the request level register 111 to enable control of the frequency parameter of the phase locked loop circuit 102 and the voltage parameter of the voltage regulator 103.

The request level register 111 stores the speed level requested from the execution unit 104. When the control unit 118 is in an idle state and the speed level held in the request level register 111 is different from the speed level held in the current level register 113 as a result of comparing the request level register 111 with the current level register 113 by the comparator 117, the target level register 112 causes the control unit to transit from the idle state to a control state, and stores the speed level in the request level register 111 at the point in time when starting the control as the target speed level in the control state. When the control unit 118 is in an idle state, the current level register 113 stores the current speed level.

The target level register 112 stores the target speed level in the control state at present, so that the execution unit 104 can write the next speed level into the request level register 111 without waiting for completion of the control by the control unit 118 even in the middle of control. Even if the writing has been performed, the aforementioned control by the control unit 118 is continued and the request from the execution unit 104 is held in the request level register 111. After completion of the control by the control unit 118, the current level register 113 stores therein the speed level in the target level register 112, and the comparator 117 compares the speed level held in the request level register 111 with the current level register 113, and when the speed levels are different, the new speed level held in the request level register 111 is written into the target level register 112, and control for the next target speed level is started. This control is performed by the control unit 118, and therefore does not need to be performed by the execution unit 104. The execution unit 104 enables control of the frequency parameter and the voltage parameter by simple processing of writing the speed level into the request level register 111.

FIGS. 3A and 3B are diagrams explaining the request level register 111 in FIG. 1. FIG. 3A is a diagram illustrating a bit format example of the request level register 111. The request level register 111 is a 3-bit register and stores error information 301 of one bit and a speed level 302 of two bits. As for the error information 301, "0" indicates no error, and "1" indicated error. The content of error will be explained later with reference to FIG. 6. The speed level 302 will be explained with reference to FIG. 3B.

FIG. 3B is a diagram for explaining the speed level 302 in FIG. 3A. The speed level 302 has, for example, four levels of "0" to "3" and indicates the speed of the arithmetic processing device 101. The speed level 302 of "1" is a standard speed level during system operation of the processor, and the frequency (processing performance) at this level is regarded as 100%. The speed level 302 of "0" is a speed level higher than the speed level 302 of "1" and, for example, the frequency (processing performance) at this level is 120%. The speed level 302 of "2" is a speed level lower than the speed level 302 of "1" and, for example, the frequency (processing performance) at this level is 60%. The speed level 302 of "3" is a speed level lower than the speed level 302 of "2" and, for example, the frequency (processing performance) at this level is 20%. In the example in FIG. 3B, the speed level 302 is defined as having two levels in increments of 40% in a direction of decreasing the frequency (decreasing performance) and one level in increments of 20% in a direction of increasing the frequency (increasing performance). The execution unit 104 can write the speed level 302 into the request level register 111 according to processing details such as a high-speed processing mode, a low-speed processing mode and a sleep mode.

FIGS. 4A to 4C are diagrams illustrating examples of the speed level table 114 in FIG. 1. The speed level table 114 stores the correspondence among the speed level, the frequency identification number and the voltage identification number. The speed level corresponds to the speed level in FIG. 3B, and the frequency identification number corresponds to the frequency identification number in FIG. 2A and the voltage identification number corresponds to the voltage identification number in FIG. 2B.

The speed level table 114 in FIG. 4A will be explained. In the speed level table 114, the relationship between the frequency and the voltage in a semiconductor circuit is defined in which as the frequency of the semiconductor circuit increases, the voltage required by the semiconductor circuit also increases. The speed level of "1" is associated with a frequency identification number "9" and a voltage identification number "18." The frequency identification number "9" corresponds, for example, to a frequency parameter of "1.0" GHz as illustrated in FIG. 2A. The voltage identification number "18" corresponds, for example, to a voltage parameter of "1.10" V as illustrated in FIG. 2B. As described above, the speed level of "1" means the frequency of "1.0" GHz and the frequency of "1.0" GHz means 100% frequency (processing performance) as illustrated in FIG. 3B. This means that the arithmetic processing device 101 requires the voltage V1 of "1.10" V for operation with a clock signal CK having the frequency of "1.0" GHz.

The speed level of "0" is associated with a frequency identification number "11" and a voltage identification number "28." The frequency identification number "11" corresponds, for example, to a frequency parameter of "1.2" GHz as illustrated in FIG. 2A. The voltage identification number "28" corresponds, for example, to a voltage parameter of "1.60" V as illustrated in FIG. 2B. As described above, the speed level of "0" means the frequency of "1.2" GHz and the frequency of "1.2" GHz means 120% frequency (processing performance) as illustrated in FIG. 3B. This means that the arithmetic processing device 101 requires the voltage V1 of "1.60" V to operate with a clock signal CK having the frequency of "1.2" GHz.

The speed level of "2" is associated with a frequency identification number "5" and a voltage identification number "15." The frequency identification number "5" corresponds, for example, to a frequency parameter of "0.6" GHz as illustrated in FIG. 2A. The voltage identification number "15" corresponds, for example, to a voltage parameter of "0.95" V as illustrated in FIG. 2E. As described above, the speed level of "2" means the frequency of "0.6" GHz and the frequency of "0.6" GHz means 60% frequency (processing performance) as illustrated in FIG. 3B. This means that the arithmetic processing device 101 requires the voltage V1 of "0.95" V to operate with a clock signal CK having the frequency of "0.6" GHz.

The speed level of "3" is associated with a frequency identification number "1" and a voltage identification number "2." The frequency identification number "1" corresponds, for example, to a frequency parameter of "0.2" GHz as illustrated in FIG. 2A. The voltage identification number "2" corresponds, for example, to a voltage parameter of "0.30" V as illustrated in FIG. 2B. As described above, the speed level of "3" means the frequency of "0.2" GHz and the frequency of "0.2" GHz means 20% frequency (processing performance) as illustrated in FIG. 3B. This means that the arithmetic processing device 101 requires the voltage V1 of "0.30" V to operate with a clock signal CK having the frequency of "0.2" GHz.

As described above, as the speed level is increased, the frequency also increases in the speed level table 114. For operation with the clock signal CK having the frequency, an appropriate minimum voltage required by the semiconductor circuit is set by the speed level table 114 in terms of the reduction in power consumption.

FIG. 4B is a diagram illustrating an example of the speed level table 114 of an arithmetic processing device 101 different from the arithmetic processing device 101 in FIG. 4A. The arithmetic processing device 101 in FIG. 4B is of the same kind as that of the arithmetic processing device 101 in FIG. 4A. Therefore, the speed level table 114 in FIG. 4B is the same in speed level and frequency identification number as but different in voltage identification number from the speed level table 114 in FIG. 4A. For operation with the clock signal CK having each frequency, an appropriate voltage is different for each individual chip of the arithmetic processing device 101. Therefore, even for the same kind of arithmetic processing device 101, different voltage identification numbers are stored in the speed level table 114 for each arithmetic processing device 101 because of the individual difference between chips.

FIG. 4C is a diagram illustrating an example of the speed level table 114 of an arithmetic processing device 101 further different from the arithmetic processing devices 104 in FIG. 4A and FIG. 4B. The arithmetic processing device 101 in FIG. 4C is a higher performance arithmetic processing device in the next generation with respect to the arithmetic processing devices 101 in FIG. 4A and FIG. 4B. Therefore, the setting value of the standard frequency (speed level "1") during system operation is higher in the speed level table 114 in FIG. 4C than in the speed level tables 114 in FIG. 4A and FIG. 4B, and the correspondence between the frequency identification number and the voltage identification number in the whole speed level table is therefore different. Because of the arithmetic processing device in the next generation, the voltage required for the frequency is different due to the manufacturing rule, manufacturing process and so on. As a result, the speed level table 114, even at the same speed level, is different in frequency identification number and voltage identification number.

In FIG. 1, the non-volatile memory 115 is, for example, a ROM (Read Only Memory) or a FLASK memory, and stores the speed level table 114 as illustrated in FIGS. 4A to 4C. Tuning on the power of the arithmetic processing device 101, the stored content of the speed level table 114 is initialized to the content in the speed level table stored in the non-volatile memory 115 by the initialization processing. The non-volatile memory 115 stores a speed level table different for each arithmetic processing device 101, thereby making it possible to initialize the speed level table 114 to the stored content suitable for each arithmetic processing device 101. This enables initialization of the speed level table 114 for the individual voltage of the arithmetic processing device 101 obtained by the test result and easily change the relationship between the frequency and the voltage to each speed level.

The control unit 118 has a state machine and controls state transition by the state machine. The details of the state machine of the control unit 118 will be explained later with reference to FIG. 5. Referring again to FIG. 1, the comparator 117 compares the speed level stored in the request level register 111 with the speed level stored in the current level register 113 and outputs the comparison result to the control, unit 118. Specifically, when the execution unit 104 writes the speed level into the request level register 111 and the speed level in the request level register 111 thereby becomes a level different from the speed level in the current level register 113, the control unit 118 starts control of the frequency parameter and the voltage parameter. Into the target level register 112, the speed level stored in the request level register 111 is written.

The speed level selector 116 selects a frequency identification number and a voltage identification number corresponding to the speed level stored in the target level register 112 in the speed level table 114 and outputs them to the frequency comparator 119 and the voltage comparator 120 respectively.

The frequency counter 122 counts the frequency identification number up to the frequency identification number in the speed level table 114 corresponding to the target speed level by control of the determination unit 121. The voltage counter 123 counts the voltage identification number up to the voltage identification number in the speed level table 114 corresponding to the target speed level by control of the determination unit 121.

The frequency comparator 119 outputs an up signal UP to the determination unit 121 when the frequency identification number counted by the frequency counter 122 is smaller than the frequency identification number outputted from the speed level selector 116, and outputs a down signal DN to the determination unit 121 when the frequency identification number counted by the frequency counter 122 is larger than the frequency identification number outputted from the speed level selector 116.

The voltage comparator 120 outputs an up signal UP to the determination unit 121 when the voltage identification number counted by the voltage counter 123 is smaller than the voltage identification number outputted from the speed level selector 116, and outputs a down signal DN to the determination unit 121 when the voltage identification number counted by the voltage counter 123 is larger than the voltage identification number outputted from the speed level selector 116.

The determination unit 121 outputs an increment signal INC or a decrement signal DEC to the frequency counter 122 or the voltage counter 123 according to the aforementioned up signal Up and down signal DK. The details will be explained later with reference to FIG. 6. The frequency counter 122 increments the frequency identification number upon reception of input of the increment signal INC or decrements the frequency identification number upon reception of input of the decrement signal DEC. The voltage counter 123 increments the voltage identification number upon reception of input of the increment signal INC or decrements the voltage identification number upon reception of input of the decrement signal DEC.

The frequency selector 125 selects a frequency parameter in the frequency table 124 corresponding to the frequency identification number counted by the frequency counter 122 and outputs the selected frequency parameter to the phase locked loop circuit 102. The phase locked loop circuit 102 receives input of the frequency parameter outputted from the frequency selector 125, generates a clock signal CK having a frequency according to the inputted frequency parameter, and outputs the clock signal CK to the execution unit 104.

The voltage selector 12 selects a voltage parameter in the voltage table 126 corresponding to the voltage identification number counted by the voltage counter 123 and outputs the selected voltage parameter to the voltage regulator 103. The voltage regulator 103 receives input of the voltage parameter outputted from the voltage selector 127, generates a voltage V1 having a magnitude corresponding to the inputted voltage parameter, and outputs the voltage V1 to the execution unit 104.

FIG. 5 is diagram illustrating the state transition controlled by the control unit 118 in FIG. 1. The state transition by the control unit 118 can be divided into an idle state and control states other than the idle state. At the initial time, the state is an idle state S1. When the execution unit 104 writes the speed level into the request level register 111 and the comparator 117 outputs the fact that the speed level in the request level register 111 is different from the speed level in the current level register 113 to the control unit 118, the control unit 118 transits the state from the idle state S1 to a comparison state S2 among the control states. From the comparison state S2, the state transits to each control state such as the idle state S1, an error state S3, a frequency count stats S4, or a voltage count state S5. The details will be explained with reference to FIG. 6.

FIG. 6 is a diagram for explaining transition from the comparison state S2 to the next state in FIG. 5. In the comparison state S2, the frequency comparator 119 and the voltage comparator 120 perform comparison. The frequency comparator 119 outputs an up signal UP of "0" and a down signal DN of "0" when the frequency identification number counted by the frequency counter 122 is the same as the frequency identification number outputted from the speed level selector 116. Further, the frequency comparator 119 outputs an up signal UP of "1" and a down signal DN of "0" when the frequency identification number counted by the frequency counter 122 is smaller than the frequency identification number outputted from the speed level selector 116. Further, the frequency comparator 119 outputs an up signal UP of "0" and a down signal DN of "1" when the frequency identification number counted by the frequency counter 122 is larger than the frequency identification number output ted from the speed level selector 116.

The voltage comparator 120 outputs an up signal UP of "0" and a down signal DN of "0" when the voltage identification number counted by the voltage counter 123 is the same as the voltage identification number outputted from the speed level selector 116. Further, the voltage comparator 120 outputs an up signal UP of "1" and a down signal DN of "0" when the voltage identification number counted by the voltage counter 123 is smaller than the voltage identification number outputted from the speed level selector 116. Further, the voltage comparator 120 outputs an up signal UP of "0" and a down signal DN of "1" when the voltage identification number counted by the voltage counter 123 is larger than the voltage identification number outputted from the speed level selector 116.

The determination unit 121 instructs the control unit 118 to perform transition to the next state according to the up signal UP and the down signal DN of the frequency comparator 119 and the up signal UP and the down signal DN of the voltage comparator 120.

When the up signal UP of the frequency comparator 119 is "0" and the down signal ON is "0" and the up signal UP of the voltage comparator 120 is "0" and the down signal DN is "0" the control is finished, and since the target speed level is reached, the state transits from the comparison state S2 to the idle state S1. In the idle state S1, the speed level stored in the target level register 112 is written into the current level register 113.

When the up signal UP of the frequency comparator 119 is "0" and the down signal DN is "0" and the up signal UP of the voltage comparator 120 is "0" and the down signal DN is "1," to decrease the voltage by one step, the state transits from the comparison state S2 to the voltage count state S5. The determination unit 121 outputs the decrement signal DEC to the voltage counter 123 and the voltage counter 123 decrements the voltage identification number.

When the up signal UP of the frequency comparator 119 is "0" and the down signal DN is "0" and the up signal UP of the voltage comparator 120 is "1" and the down signal DN is "0," to increase the voltage by one step, the state transits from the comparison state S2 to the voltage count state S5. The determination unit 121 outputs the increment signal INC to the voltage counter 123 and the voltage counter 123 increments the voltage identification number.

When the up signal UP of the frequency comparator 119 is "0" and the down signal DN is "0" and the up signal UP of the voltage comparator 120 is "1" and the down signal DN is "1," the state is contradictory, and the state transits from the comparison state S2 to the error state S3.

When the up signal UP of the frequency comparator 119 is "0" and the down signal DN is "1" and the up signal DP of the voltage comparator 120 is "0" and the down signal DN is "0," to decrease the frequency by one step, the state transits from the comparison state 32 to the frequency count state S4. The determination unit 121 outputs the decrement signal DEC to the frequency counter 122 and the frequency counter 122 decrements the frequency identification number.

When the up signal UP of the frequency comparator 119 is "0" and the down signal DN is "1" and the up signal UP of the voltage comparator 120 is "0" and the down signal DN is "1," to decrease only the frequency by one step, the state transits fro m the comparison state S2 to the frequency count state S4. The determination unit 121 outputs the decrement signal DEC to the frequency counter 122 and the frequency counter 122 decrements the frequency identification number.

When the up signal UP of the frequency comparator 119 is "0" and the down signal DN is "1" and the up signal UP of the voltage comparator 120 is "1" and the down signal DN is "0," the state is contradictory, and the state transits from the comparison state S2 to the error state S3.

When the up signal UP of the frequency comparator 119 is "0" and the down signal DN is "1" and the up signal UP of the voltage comparator 120 is "1" and the down signal DN is "1,"

the state is contradictory, and the state transits from the comparison state S2 to the error state S3.

When the up signal UP of the frequency comparator 119 is "1" and the down signal DN is "0" and the up signal. UP of the voltage comparator 120 is "0" and the down signal DN is "0," to increase the frequency by one step, the state transits from the comparison state S2 to the frequency count state S1. The determination unit 121 outputs the increment signal INC to the frequency counter 122 and the frequency counter 122 increments the frequency identification number.

When the up signal UP of the frequency comparator 119 is "1" and the down signal DN is "0" and the up signal UP of the voltage comparator 120 is "0" and the down signal DN is "1," the state is contradictory, and the state transits from the comparison state S2 to the error state S3.

When the up signal UP of the frequency comparator 119 is "1" and the down signal DN is "0" and the up signal UP of the voltage comparator 120 is "1" and the down signal DN is "0," to increase the voltage by one step, the state transits from the comparison state S2 to the voltage count state S5. The determination unit 121 outputs the increment signal INC to the voltage counter 123 and the voltage counter 123 increments the voltage identification number.

When the up signal UP of the frequency comparator 119 is "1" and the down signal DN is "0" and the up signal UP of the voltage comparator 120 is "1" and the down signal DN is "1," the state is contradictory, and the state transits from the comparison state S2 to the error state S3.

When the up signal UP of the frequency comparator 119 is "1" and the down signal DN is "1" and the up signal UP of the voltage comparator 120 is "0" and the down signal DN is "0," the state is contradictory, and the state transits from the comparison state S2 to the error state S3.

When the up signal UP of the frequency comparator 119 is "1" and the down signal DN is "1" and the up signal UP of the voltage comparator 120 is "0" and the down signal DN is "1," the state is contradictory, and the state transits from the comparison state S2 to the error state S3.

When the up signal UP of the frequency comparator 119 is "1" and the down signal DN is "1" and the up signal UP of the voltage comparator 120 is "1" and the down signal DH is "0," the state is contradictory, and the state transits from the comparison state S2 to the error state S3.

When the up signal UP of the frequency comparator 119 is "1" and the down signal DN is "1" and the up signal UP of the voltage comparator 120 is "1" and the down signal DN is "1," the state is contradictory, and the state transits from the comparison state S2 to the error state S3.

In FIG. 5, in the error state S3, because of occurrence of error in hardware, information "1" indicating that there is error is written as the error information 301 into the request level register 111 in FIG. 3A. The execution unit 104 can recognize that error has occurred in the control circuit by confirming the content of the error information 301 written into the request level register 111.

In the frequency count state S4, the state subsequently transits to the frequency control state S6. In the frequency control state S6, the frequency selector 125 selects a frequency parameter in the frequency table 124 corresponding to the frequency identification number counted by the frequency counter 122 and outputs the selected frequency parameter to the phase locked loop circuit 102. The phase locked loop circuit 102 generates a clock signal CK having a frequency according to the inputted frequency parameter. After completion of the control of the frequency control state S6, the state returns to the aforementioned comparison state S2.

In the voltage count state S5, the state subsequently transits to the voltage control state S7. In the voltage control state S7, the voltage selector 127 selects a voltage parameter in the voltage table 126 corresponding to the voltage identification number counted by the voltage counter 123 and outputs the selected voltage parameter to the voltage regulator 103. The voltage regulator 103 generates a voltage V1 having a magnitude according to the inputted voltage parameter. After completion of the control of the voltage control state S7, the state returns to the aforementioned comparison state S2.

FIG. 7 is a time chart illustrating a control example of the arithmetic processing device in FIG. 1. A frequency identification number 701 indicates the change of the frequency identification number with passage of time. A voltage identification number 702 indicates the change of the voltage identification number with passage of time. An example in which the frequency table 124 stores the content of FIG. 2A, the voltage table 126 stores the content of FIG. 2B, and the speed level table 114 stores the content of FIG. 4A will be explained.

At time "1," the request level register 111, the target level register 112, and the current level register 113 are initialized to a speed level of "1." As illustrated in FIG. 4A, the speed level of "1" corresponds to the frequency identification number "9" and the voltage identification number "18" as illustrated in FIG. 4A. Therefore, the frequency identification number 701 being the count value of the frequency counter 122 is initialized to "9" and the voltage identification number 702 being the count value of the voltage counter 123 is initialized to "18." The phase locked loop circuit 102 receives input of a frequency parameter corresponding to the frequency identification number "9" and generates a clock signal CK having a frequency of "1.0" GHz as illustrated in FIG. 2A. The voltage regulator 103 receives input of a voltage parameter corresponding to the voltage identification number "18" and generates a voltage V1 of "1.10" V as illustrated in FIG. 2B.

Next, at time "3", the execution unit 104 writes a speed level of "3" into the request level register 111. Then, the speed level of "3" is written into the target level register 112. More specifically, in a state that the speed level stored in the request level register 111 and the speed level stored in the current level register 113 are the same, when a speed level different from the speed level stored in the current level register 113 is written into the request level register 111, the speed level written info the request level register 111 is written into the target level register 112 as the target speed level.

Hereinafter, control of changing from the speed level of "1" to the speed level of "3" is performed. The speed level selector 116 refers to the speed level table 114 in FIG. 4A, selects the frequency identification number "1" and the voltage identification number "2" corresponding to the speed level of "3," and outputs them to the frequency comparator 119 and the voltage comparator 120 respectively. The frequency comparator 119 compares the frequency identification number "9" outputted from the frequency counter 122 with the frequency identification number "1" outputted from the speed level selector 116 and outputs an up signal UP of "0" and a down signal DN of "1" to the determination unit 121. The voltage comparator 120 compares the voltage identification number "18" outputted from the voltage counter 123 with the voltage identification number "2" outputted from the speed level selector 116 and outputs an up signal UP of "0" and a down signal DN of "1" to the determination unit 121. The determination unit 121 outputs a decrement signal DEC to the frequency counter 122 as illustrated in FIG. 6.

Next, at time "4", the frequency counter 122 decrements the frequency identification number 701 from "9" to "8." The phase locked loop circuit 102 receives input of a frequency parameter corresponding to the frequency identification number "8" and generates a clock signal CK having a frequency of "0.9" GHz as illustrated in FIG. 2A. The voltage regulator 103 receives input of a voltage parameter corresponding to the voltage identification number "18" and generates a voltage V1 of "1.10" V as illustrated in FIG. 2B.

Next, the frequency comparator 119 compares the frequency identification number "8" outputted from the frequency counter 122 with the frequency identification number "1" outputted from the speed level selector 116 and outputs an up signal UP of "0" and a down signal DN of "1" to the determination unit 121. The voltage comparator 120 compares the voltage identification number "18" outputted from the voltage counter 123 with the voltage identification number "2" outputted from the speed level selector 116 and outputs an up signal UP of "0" and a down signal DN of "1" to the determination unit 121. The determination unit 121 outputs a decrement signal DEC to the frequency counter 122 as illustrated in FIG. 6.

Next, at time "3", the frequency counter 122 decrements the frequency identification number 701 from "3" to "7." The phase locked loop circuit 102 receives input of a frequency parameter corresponding to the frequency identification number "7" and generates a clock signal CK having a frequency of "0.8" GHz as illustrated in FIG. 2A, The voltage regulator 103 receives input of a voltage parameter corresponding to the voltage identification number "18" and generates a voltage V1 of "1.10" V as illustrated in FIG. 2B.

As in the above, at time "6", the frequency counter 122 decrements the frequency identification number 701 from "7" to "6." At time "7", the frequency counter 122 decrements the frequency identification number 701 from to "5." At time the frequency counter 122 decrements the frequency identification number 701 from "5" to "4," At time "9", the frequency counter 122 decrements the frequency identification number 701 from "4" to "3." At time "10", the frequency counter 122 decrements the frequency identification number 701 from "3" to "2." At time "11", the frequency counter 122 decrements the frequency identification number 701 from "2" to "1."

The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "18" and generates a voltage V1 of "1.10" V as illustrated in FIG. 2B.

Next, the frequency comparator 119 compares the frequency identification number "1" outputted from the frequency counter 122 with the frequency identification number "1" outputted from the speed level selector 116 and outputs an up signal UP of "0" and a down signal DN of "0" to the determination unit 121. The voltage comparator 120 compares the voltage identification number "18" outputted from the voltage counter 123 with the voltage identification number "2" outputted from the speed level selector 116 and outputs an up signal UP of "0" and a down signal DN of "1" to the determination unit 121. The determination unit 121 outputs a decrement signal DEC to the voltage counter 123 as illustrated in FIG. 6.

Next, at time "12", the voltage counter 123 decrements the voltage identification number 702 from "18" to "17." The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "17" and generates a voltage V1 of "1.05" V as illustrated in FIG. 2B.

Next, the frequency comparator 119 compares the frequency identification number "1" outputted from the frequency counter 122 with the frequency identification number "1" outputted from the speed level selector 116 and outputs an up signal UP of "0" and a down signal DN of "0" to the determination unit 121. The voltage comparator 120 compares the voltage identification number "17" outputted from the voltage counter 123 with the voltage identification number "2" outputted from the speed level selector 116 and outputs an up signal UP of "0" and a down signal DN of "1" to the determination unit 121. The determination unit 121 outputs a decrement signal DEC to the frequency counter 122 as illustrated in FIG. 6.

Next, at time "13", the voltage counter 123 decrements the voltage identification number 702 from "17" to "16." The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "16" and generates a voltage V1 of "1.00" V as illustrated in FIG. 2B.

By repeating the same processing as the above, the voltage identification number 702 is sequentially decremented. At time "27", the frequency identification number 701 of the frequency counter 122 becomes "1" and the voltage identification number 702 of the voltage counter 123 becomes "2." The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "2" and generates a voltage V1 of "0.30" V as illustrated in FIG. 2B.

Next, the frequency comparator 119 compares the frequency identification number "1" outputted from the frequency counter 122 with the frequency identification number "1" outputted from the speed level selector 116 and outputs an up signal UP of "0" and a down signal DN of "0" to the determination unit 121. The voltage comparator 120 compares the voltage identification number "2" outputted from the voltage counter 123 with the voltage identification number "2" outputted from the speed level selector 116 and outputs an up signal UP of "0" and a down signal DN of "0" to the determination unit 121. The determination unit 121 transits to the idle state S1 as illustrated in FIG. 6. In the idle state S1, the speed level of "3" is written into the current level register 113.

With the above, the control of changing from the speed level of "1" to the speed level of "3" is completed. For decreasing the speed level from "1" to "3," only the frequency is decreased stepwise by 0.1 GHz from 1.0 GHz down to 0.2 GHz by the frequency identification number 701 as described above. Thereafter, only the voltage is decreased stepwise by 0.05 V from 1.10 V down to 0.30 V by the voltage identification number 702. As described above, to decrease the speed level, it is necessary to first decrease the frequency by the frequency identification number 701 to create a state in which the voltage can be decreased, and then to decrease the voltage by the voltage identification number 702.

Specifically, as illustrated in FIG. 6, when the frequency comparator 119 outputs the comparison result that the frequency of the frequency identification number 701 counted by the frequency counter 122 is higher than the frequency of the frequency identification number outputted from the speed level selector 116 and the voltage comparator 120 outputs the comparison result that the voltage of the voltage identification number 702 counted by the voltage counter 123 is higher than the voltage of the voltage identification number outputted from the speed level selector 116, the frequency counter 122 counts the frequency identification number 701 in a direction in which the frequency decreases and the voltage counter 123 stops the count of the voltage identification number 702.

Further, when the frequency comparator 119 outputs the comparison result that the frequency identification number 701 counted by the frequency counter 122 is the same as the frequency identification number outputted from the speed level selector 116 and the voltage comparator 120 outputs the comparison result that the voltage of the voltage identification number 702 counted by the voltage counter 123 is higher than the voltage of the voltage identification number outputted from the speed level selector 116, the frequency counter 122 stops the count of the frequency identification number 701 and the voltage counter 123 counts the voltage identification number 702 in a direction in which the voltage decreases.

Further, when the frequency comparator 119 outputs the comparison result that the frequency of the frequency identification number 701 counted by the frequency counter 122 is higher than the frequency of the frequency identification number outputted from the speed level selector 116 and the voltage comparator 120 outputs the comparison result that the voltage identification number 702 counted by the voltage counter 123 is the same as the voltage identification number outputted from the speed level selector 116, the frequency counter 122 counts the frequency identification number 701 in a direction in which the frequency decreases, and the voltage counter 123 stops the count of the voltage identification number 702.

Next, control of increasing from the speed level of "3" to the speed level of "2" will be explained. At time "29", the execution unit 104 writes a speed level of "2" into the request level register 111. Then, the speed level of "2" is written into the target level register 112. The speed level selector 116 refers to the speed level table 114 in FIG. 4A, selects the frequency identification number "5" and the voltage identification number "15" corresponding to the speed level of "2," and outputs them to the frequency comparator 119 and the voltage comparator 120 respectively. The frequency comparator 119 compares the frequency identification number "1" outputted from the frequency counter 122 with the frequency identification number "5" outputted from the speed level selector 116 and outputs an up signal UP of "1" and a down signal DN of "0" to the determination unit 121. The voltage comparator 120 compares the voltage identification number "2" outputted from the voltage counter 123 with the voltage identification number "15" outputted from the speed level selector 116 and outputs an up signal UP of "1" and a down signal DN of "0" to the determination unit 121. The determination unit 121 outputs an increment signal INC to the voltage counter 123 as illustrated in FIG. 6.

Next, at time "30", the voltage counter 123 increments the voltage identification number 702 from "2" to "3." The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "3" and generates a voltage V1 of "0.35" V as illustrated in FIG. 2B.

Next, the frequency comparator 119 compares the frequency identification number "1" outputted from the frequency counter 122 with the frequency identification number "5" outputted from the speed level selector 116 and outputs an up signal UP of "1" and a down signal DN of "0" to the determination unit 121. The voltage comparator 120 compares the voltage identification number "3" outputted from the voltage counter 123 with the voltage identification number "15" outputted from the speed level selector 116 and outputs an up signal UP of "1" and a down signal DN of "0" to the determination unit 121. The determination unit 121 outputs an increment signal INC to the voltage counter 123 as illustrated in FIG. 6.

Next, at time "31", the voltage counter 123 increments the voltage identification number 702 from "3" to "4." The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "4" and generates a voltage V1 of "0.40" V as illustrated in FIG. 2B.

By repeating the same processing as the above, the voltage identification number 702 is sequentially incremented. At time "42", the frequency identification number 701 of the frequency counter 122 becomes "1" and the voltage identification number 702 of the voltage counter 123 becomes "15." The phase locked loop circuit 102 receives input of a frequency parameter corresponding to the frequency identification number "1" and generates a clock signal CK having a frequency of "0.2" GHz as illustrated in FIG. 2A. The voltage regulator 103 receives input of a voltage parameter corresponding to the voltage identification number "15" and generates a voltage V1 of "0.95" V as illustrated in FIG. 2B.

Next, the frequency comparator 119 compares the frequency identification number "1" outputted from the frequency counter 122 with the frequency identification number "5" outputted from the speed level selector 116 and outputs an up signal UP of "1" and a down signal DN of "0" to the determination unit 121. The voltage comparator 120 compares the voltage identification number "15" outputted from the voltage counter 123 with the voltage identification number "15" outputted from the speed level selector 116 and outputs an up signal UP of "0" and a down signal of "0" to the determination unit 121. The determination unit 121 outputs an increment signal INC to the frequency counter 122 as illustrated in FIG. 6.

Next, at time "43", the frequency counter 122 increments the frequency identification number 701 from "1" to "2." The phase locked loop circuit 102 receives input of a frequency parameter corresponding to the frequency identification number "2" and generates a clock signal CK having a frequency of "0.3" GHz as illustrated in FIG. 2A. The voltage regulator 103 receives input of a voltage parameter corresponding to the voltage identification number "15" and generates a voltage V1 of "0.95" V as illustrated in FIG. 2B.

Next, the frequency comparator 119 compares the frequency identification number "2" outputted from the frequency counter 122 with the frequency identification number "5" outputted from the speed level selector 116 and outputs an up signal UP of "1" and a down signal DN of "0" to the determination unit 121. The voltage comparator 120 compares the voltage identification number "15" outputted from the voltage counter 123 with the voltage identification number "15" outputted from the speed level selector 116 and outputs an up signal UP of "0" and a down signal DN of "0"

to the determination unit 121. The determination unit 121 outputs an increment signal INC to the frequency counter 122 as illustrated in FIG. 6.

Next, at time "44", the frequency counter 122 increments the frequency identification number 701 from "2" to "3." The phase locked loop circuit 102 receives input of a frequency parameter corresponding to the frequency identification number "3" and generates a clock signal CK having a frequency of "0.4" GHz as illustrated in FIG. 2A. The voltage regulator 103 receives as input of a voltage parameter corresponding to the voltage identification number "15" and generates a voltage V1 of "0.95" V as illustrated in FIG. 2B.

By repeating the same processing as the above, the frequency identification number 701 is sequentially incremented. At time "46", the frequency identification number 701 of the frequency counter 122 becomes "5" and the voltage identification number 702 of the voltage counter 123 becomes "15." The phase locked loop circuit 102 receives input of a frequency parameter corresponding to the frequency identification number "5" and generates a clock signal CK having a frequency of "0.6" GHz as illustrated in FIG. 2A. The voltage regulator 103 receives input of a voltage parameter corresponding to the voltage identification number "15" and generates a voltage V1 of "0.95" V as illustrated in FIG. 2B.

Next, the frequency comparator 119 compares the frequency identification number "5" outputted from the frequency counter 122 with the frequency identification number "5" outputted from the speed level selector 116 and outputs an up signal UP of "0" and a down signal DN of "0" to the determination unit 121. The voltage comparator 120 compares the voltage identification number "15" outputted from the voltage counter 123 with the voltage identification number "15" outputted from the speed level selector 116 and outputs an up signal UP of "0" and a down signal DN of "0" to the determination unit 121. The determination unit 121 transits to the idle state S1 as illustrated in FIG. 6. In the idle state S1, the speed level of "2" is written into the current level register 113.

With the above, the control of changing from the speed level of "3" to the speed level of "2" is completed. For increasing the speed level from "3" to "2," only the voltage is increased stepwise by 0.05 V from 0.30 V up to 0.95 V by the voltage identification number 702 as described above. Thereafter, only the frequency is increased stepwise by 0.1 GHz from 0.2 GHz up to 0.6 GHz by the frequency identification number 701. As described above, to increase the speed level, it is necessary to first increase the voltage by the voltage identification number 702 to create a state in which the frequency can be increased, and then to increase the frequency by the frequency identification number 701.

Specifically, as illustrated in FIG. 6, when the frequency comparator 119 outputs the comparison result that the frequency of the frequency identification number 701 counted by the frequency counter 122 is lower than the frequency of the frequency identification number outputted from the speed level selector 116 and the voltage comparator 120 outputs the comparison result that the voltage of the voltage identification number 702 counted by the voltage counter 123 is lower than the volt age of the voltage identification number outputted from the speed level selector 116, the voltage counter 123 counts the voltage identification number 702 in a direction in which the voltage increases and the frequency counter 122 stops the count of the frequency identification number 701.

Further, when the frequency comparator 119 outputs the comparison result that the frequency of the frequency identification number 701 counted by the frequency counter 122 is lower than the frequency of the frequency identification number outputted from the speed level selector 116 and the voltage comparator 120 outputs the comparison result that the voltage identification number 702 counted by the voltage counter 123 is the same as the voltage identification number outputted from the speed level selector 116, the frequency counter 122 counts the frequency identification number 701 in a direction in which the frequency increases and the voltage counter 123 stops the count of the voltage identification number 702.

Further, when the frequency comparator 119 outputs the comparison result that the frequency identification number 701 counted by the frequency counter 122 is the same as the frequency identification number outputted from the speed level selector 116 and the voltage comparator 120 outputs the comparison result that the voltage of the voltage identification number 702 counted by the voltage counter 123 is lower than the voltage of the voltage identification number outputted from the speed level selector 116, the frequency counter 122 stops the count of the frequency identification number 701 and the voltage counter 123 counts the voltage identification number 702 in a direction in which the voltage increases.

According to this embodiment, even when the kind and the value of the frequency parameter and the kind and the value of the voltage parameter are different for each arithmetic processing device 101, the arithmetic processing device 101 can be coped with by changing the contents of the frequency table 124 and the voltage table 126 without a need to change the details of the program for the execution unit 104 to write the speed level into the request level register 111. Therefore, the frequency parameter and the voltage parameter can be easily controlled for various arithmetic processing devices 101.

Further, a rapid and great change in frequency of the clock signal CK causes a rapid change in load, leading to a large power noise. Further, a rapid and great change in voltage makes the power supply unstable to cause unstable operation. According to this embodiment, the frequency is changed stepwise by 0.1 GHz from the current frequency to the target frequency and the voltage is changed stepwise by 0.05 V from the current voltage to the target voltage to thereby prevent the power noise and stabilize the operation.

Further, the target level register 112 stores the target speed level under control at present, so that the execution unit 104 can write the next speed level into the request level register 111 without waiting for completion of the control even in the middle of control. Even if the writing has been performed, the control by the control unit 118 is continued and the request from the execution unit 104 is held in the request level register 111. After completion of the control by the control unit 118, the current level register 113 holds therein the speed level in the target level register 112, and the comparator 111 compares the speed level in the request level register 111 which has been just held with the current level register 113, and when the speed level held in the request level register 111 and the speed level held in the current level register 113 are different, the new speed level held in the request level register 111 is written into the target level register 112, and control for the next target speed level is started. This control is performed by the control unit 113, and therefore does not need to be performed by the execution unit 104. The execution unit 104 enables control of the frequency parameter and the voltage parameter by simple processing of writing the speed level into the request level register 111.

According to this embodiment, the frequency parameter and the voltage parameter can be controlled only by giving the target speed level, so that control of the frequency parameter and the voltage parameter can be easily performed.

Incidentally, the above-described embodiment is to be considered in all respects as illustrative and no restrictive. Namely, the present invention may be embodied in other specific forms without departing from the spirit or essential characteristics thereof.

Control of frequency information can be easily performed only by giving speed identification information about a target semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
    an oscillation unit that supplies an oscillated clock to a circuit included in the semiconductor device;
    a frequency setting information storage unit that stores a plurality of sets of frequency information indicating setting of a frequency supplied by the oscillation unit and frequency identification information identifying the frequency information and outputs one of a plurality of pieces of the frequency information to the oscillation unit based on frequency identification information inputted thereinto;
    a speed setting information storage unit that stores speed identification information indicating a speed of the semiconductor device and frequency identification information corresponding to the speed identification information;
    a frequency identification information count unit that holds a value of the frequency identification information inputted into the frequency setting information storage unit; and
    a control unit that causes the frequency identification information count unit to increment or decrement the held value of the frequency identification information to approach a value of the frequency identification information stored in the speed setting information storage unit.

2. The semiconductor device according to claim 1,
    wherein the speed setting information storage unit further stores voltage identification information corresponding to the speed identification information,
    wherein the semiconductor device further comprises:
        a power supply unit that supplies voltage to the circuit;
        a voltage setting information storage unit that stores a plurality of sets of voltage information indicating setting of the voltage supplied by the power supply unit and voltage identification information identifying the voltage information and outputs one of a plurality of pieces of the voltage information to the power supply unit based on voltage identification information inputted thereinto; and
        a voltage identification information count unit that holds a value of the voltage identification information inputted into the speed setting information storage unit, and
    wherein the control unit further causes the voltage identification information count unit to increment or decrement the held value of the voltage identification information to approach a value of the voltage identification information stored in the speed setting information storage unit.

3. The semiconductor device according to claim 2, further comprising:
    a voltage identification information comparison unit that compares the value of the voltage identification information stored in the speed setting information storage unit with the value of the voltage identification information held in the voltage identification information count unit,
    wherein the control unit causes the voltage identification information count unit to increment or decrement the held value of the voltage identification information based on a result of comparison by the voltage identification information comparison unit.

4. The semiconductor device according to claim 1, further comprising:
    a frequency identification information comparison unit that compares the value of the frequency identification information stored in the speed setting information storage unit with the value of the frequency identification information held in the frequency identification information count unit,
    wherein the control unit causes the frequency identification information count unit to increment or decrement the held value of the frequency identification information based on a result of comparison by the frequency identification information comparison unit.

5. A control method for a semiconductor device comprising: a frequency setting information storage unit that stores a plurality of sets of frequency information indicating setting of a frequency supplied by an oscillation unit and frequency identification information identifying the frequency information; a speed setting information storage unit that stores speed identification information indicating a speed of the semiconductor device and frequency identification information corresponding to the speed identification information; a frequency identification information count unit that holds a value of the frequency identification information inputted info the frequency setting information storage unit, the method comprising:
    the oscillation unit included in the semiconductor device supplying an oscillated clock to a circuit included in the semiconductor device; and
    the frequency setting information storage unit included in the semiconductor device outputting one of a plurality of pieces of the stored frequency information to the oscillation unit based on frequency identification information inputted thereinto, and
    wherein the semi, conductor device further comprises a control unit that causes the frequency identification information count unit to increment or decrement the held value of the frequency identification information to approach a value of the frequency identification information stored in the speed setting information storage unit.

6. The control method for a semiconductor device according to claim 5,
    wherein the semiconductor device further comp rises:
        a power supply unit that supplies voltage to the circuit;
        a voltage setting information storage unit that stores a plurality of sets of voltage information indicating setting of the voltage supplied by the power supply unit and voltage identification information identifying the voltage information and outputs one of a plurality of pieces of the voltage information to the power supply unit based on voltage identification information inputted thereinto; and a voltage identification information count unit that holds a value of the voltage identification information inputted into the speed setting information storage unit, wherein the speed setting information storage unit further stores voltage identification information corresponding to the speed identification information, and wherein the control unit further causes the voltage identification information count unit to increment or decrement the held value of the voltage identification information to approach a value of the voltage identification information stored in the speed setting information storage unit.

7. The control method for a semiconductor device according to claim 6, wherein the semiconductor device further comprises a voltage identification information comparison unit that compares the value of the voltage identification information stored in the speed setting information storage unit with the value of the voltage identification information held in the voltage identification information count unit, and wherein the control unit causes the voltage identification information count unit to increment or decrement the held value of the voltage identification information based on a result of comparison by the voltage identification information comparison unit.

8. The control method for a semiconductor device according to claim 5, wherein the semiconductor device further comprises a frequency identification information comparison unit that compares the value of the frequency identification information stored in the speed setting information storage unit with the value of the frequency identification information held in the frequency identification information count unit, and wherein the control unit causes the frequency identification information count unit to increment or decrement the held value of the frequency identification information based on a result of comparison by the frequency identification information comparison unit.

* * * * *